United States Patent [19]

Long

[11] Patent Number: 4,771,330
[45] Date of Patent: Sep. 13, 1988

[54] WIRE BONDS AND ELECTRICAL CONTACTS OF AN INTEGRATED CIRCUIT DEVICE

[75] Inventor: Jon Long, Livermore, Calif.

[73] Assignee: LSI Logic Corporation, Milpitas, Calif.

[21] Appl. No.: 49,641

[22] Filed: May 13, 1987

[51] Int. Cl.⁴ .............................................. H01L 39/02
[52] U.S. Cl. ....................................... 357/80; 357/68; 357/69; 357/70
[58] Field of Search ........................ 357/68, 69, 70, 80

[56] References Cited

U.S. PATENT DOCUMENTS

| | | | |
|---|---|---|---|
| 4,479,298 | 10/1984 | Hug | 357/70 |
| 4,496,965 | 1/1985 | Orcutt et al. | 357/70 |
| 4,663,650 | 5/1987 | Gilder, Jr. et al. | 357/70 |
| 4,672,421 | 6/1987 | Lin | 357/80 |
| 4,701,781 | 10/1987 | Sankhagowit | 357/70 |

FOREIGN PATENT DOCUMENTS

| | | | |
|---|---|---|---|
| 56-24958 | 3/1981 | Japan | 357/70 |
| 57-7953 | 1/1982 | Japan | 357/70 |

Primary Examiner—Martin H. Edlow
Assistant Examiner—Gregory A. Key
Attorney, Agent, or Firm—Nathan N. Kallman; Alan H. MacPherson; Paul J. Winters

[57] ABSTRACT

An integrated circuit devicer package includes a rigid frame and flexible tape assembly having wire leads between the die attach pad, conductive lead fingers, and the I.C. chip. A dam structure prevents resin flow to ensure proper wire bonding and a wedge prevents electrical shorting. A recognition pattern enables precise wire bonding. A epoxy molding compound is interposed in cavities formed in a Kapton layer to preclude delamination.

5 Claims, 4 Drawing Sheets

WIRE BONDS AND ELECTRICAL CONTACTS OF AN INTEGRATED CIRCUIT DEVICE

CROSS-REFERENCE TO COPENDING APPLICATION

In copending U.S. patent application Ser. No. 07/008,208 entitled "Support Assembly for Integrated Circuits," filed Jan. 28, 1987, on behalf of V. K. Sahakian, et al., and assigned to the same assignee, a support assembly for an integrated circuit (IC) device is disclosed. The patent application describes an IC package which includes a composite support assembly formed with a rigid lead frame and a thin flexible tape like structure having inner and outer lead fingers for connection to the bonding pads of the IC device and to external circuitry. The present invention is applicable to the structure disclosed in the above cited patent application, which is incorporated by reference herein.

BACKGROUND OF THE INVENTION

1. Field of the Invention

This invention relates to IC devices and in particular to the formation of wiring connections of integrated circuits.

2. Description of the Prior Art

During manufacture of IC devices, the circuit elements are formed on a die, and the IC die assembly is joined to a die attach pad, typically by an epoxy adhesive. Electrical lead wires are bonded to contact points of the IC device by bonding to conductive elements or fingers and/or with the die attach pad. The lead wires in turn are coupled to external circuitry for processing data and control signals.

During the attachment of the IC die to the die attach pad, the epoxy adhesive which is made with a resin tends to bleed and flow along the surface of the pad beyond the area of joinder of the die and the pad. The flow of resin makes it difficult to properly bond the lead wires to the conductive die attach pad. With prior art processes, it is necessary to exercise stringent control of the application of the adhesive material while it is being dispensed. Furthermore, limitations on the chemical properties of the adhesive are imposed. As a result, the problem of lead wire bonding becomes time-consuming and costly.

An additional problem associated with making wire connections is the possibility of electrical shorting to the die attach pad that may occur during the bonding of the lead wires to the lead fingers, which requires extra care and testing during production. The die attach pad is made of an electrically conductive material, such as copper. The noninsulated lead wires when bonded to the lead fingers can inadvertently make contact with the conductive die attach pad, thereby creating an electrical shorting condition.

Also, during the mass production of IC devices, a multiplicity of lead wires are connected by means of automated bonding equipment to electrical contact points and bonding pads. Prior production techniques relied on an operator to designate the lead area visually, and a computer to provide alignment of the contact points that are to be bonded by bonder apparatus having capillaries for providing the bonding material. As a result of the dramatic increase in the number of lead wires which are used with IC devices and the limitations of size and space provided between the components of an IC device, the lead wires by necessity are very closely spaced, thus requiring very accurate and precise bonding in order to avoid erratic connections and electrical shorting. Therefore, during the bonding process, it is necessary to align the capillaries of the bonder appratus precisely relative to the electrical contact points on the bond pad of the die attach pad of the IC assembly.

Furthermore, with the composite rigid frame and flexible tape assembly, such as disclosed in the aforementioned copending U.S. patent application, it has been observed that when the IC device is subjected to a high temperature, such as occurs during vapor phase assembly which employs a temperature greater than 214° Centigrade for example, or during heat testing, a "clam shell" effect occurs. This clam shell effect causes the lead fingers or wires of the IC assembly to bow or separate so as to distort the planar elements of the IC device, which makes the device unusable.

Another problem that may occur as a result of the production process is the delamination of the Kapton layer that secures the lead fingers of the frame and tape assembly. During manufacture of an IC device incorporating the design disclosed in the aforementioned copending patent application, an insulating film made of a material such as Kapton (a product of DuPont Corp.) is deposited on the flexible tape-like structure. The Kapton film serves to secure the thin flexible conductive leads formed with the tape-like structure, and electrically insulates the leads from each other. Kapton material is subject to becoming brittle in the presence of moisture. Also, a continuous film of Kapton has a tendency to delaminate from the tape-like structure.

SUMMARY

An object of this invention is to provide an integrated circuit (IC) assembly wherein the problems associated with the assembly of the electrical leads of the integrated circuit assembly are effectively eliminated.

Another object of this invention is to provide an IC device wherein the bonding of lead wires between the IC chip and the electrical contact points of a bond pad of the IC assembly is facilitated.

Another object is to provide an IC device wherein electrical shorting of the electrical leads to the die attach pad is effectively minimized.

A further object is to provide an IC device wherein structural distortion that may result when the IC device is subjected to high temperatures is avoided.

According to one feature of this invention, a dam made of insulating material is formed on the die attachment pad to encompass the IC die structure. The dam limits the flow of resin of the epoxy adhesive, which is used for attaching the IC die to the die attach pad, and the resin is contained within a cavity formed between the dam and the die.

Another feature of this invention is the provision of an insulator ridge which ensures that the bond wires remain spaced from the conductive die attachment pad to preclude electrical shorting.

An additional feature of this invention is the provision of a recognition pattern at specified locations on the flexible tape like structure. The pattern is sensed by an optical sensor, for example, to generate signals that are directed to a computer actuated bonder, which is aligned accurately with the electrical connection points on the bond pad of the IC assembly.

A further feature of this invention is the provision of an insulating molding material that is interposed in cavities between the Kapton layer to ensure that the lead fingers of the composite frame and tape assembly are securely held.

DESCRIPTION OF THE DRAWING

The invention will be described in detail with reference to the drawing in which.

Similar numerals refer to similar elements throughout the drawing.

DETAILED DESCRIPTION OF THE INVENTION

Figure 1:
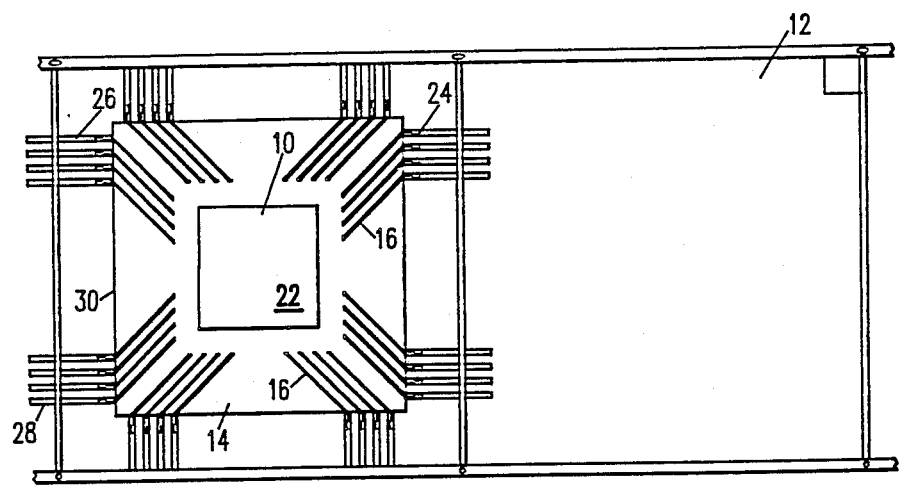
FIG. 1 is a top plan view of a support assembly for an IC chip, such as disclosed in the aforementioned U.S. patent application.
Figure 2:
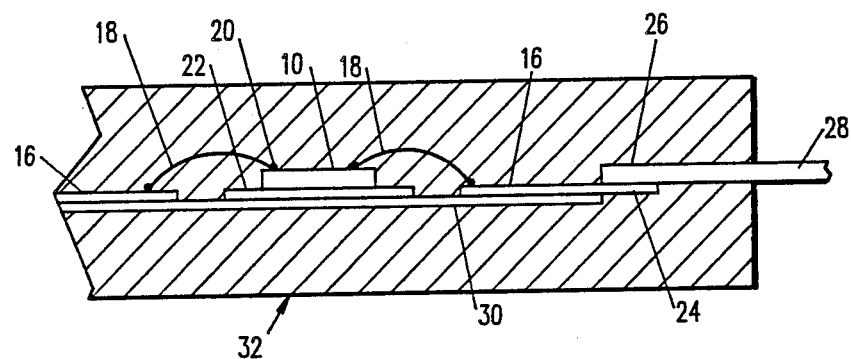
FIG. 2 is an enlarged side sectional view of a support assembly for an IC chip, which incorporates a flexible tape-like structure and rigid lead frame assembly, such as disclosed in the referenced U.S. patent application.
Figure 6:
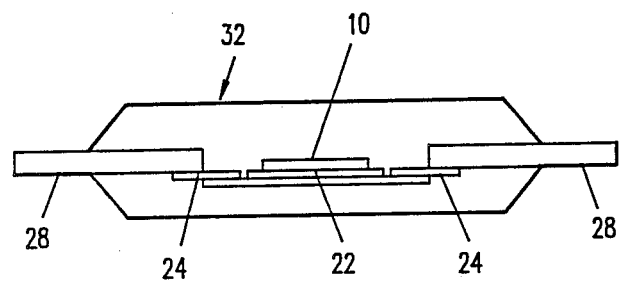
FIG. 6 is a representational sectional view of a package including the frame and tape assembly which incorporates the novel features of this invention.

With reference to FIGS. 1 and 2, an IC assembly comprises an IC chip 10 that is mounted to a die attach pad 22. Bond wires 18 are connected at one end to the surface of the IC chip device and at the other end to lead fingers 16. The outer portions 24 of the lead fingers 16 are in electrical contact with lead bonds 26 which extend from the enclosing package 32 to provide package leads 28. The package leads 28 are connectable to conductive leads or wires that are provided by external circuitry. In this manner, the integrated circuit has a conductive path through the IC package to external circuits for the transfer and exchange of data signals.

Figure 3A:
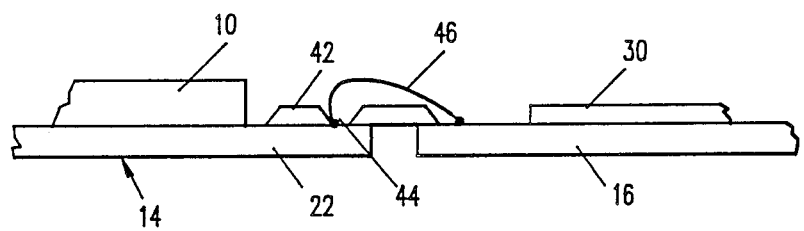
FIGS. 3a–d are sectional side views of portions, broken away of the support assembly, illustrating the dam and wedge structures embodied in the inventive structure.
Figure 3B:
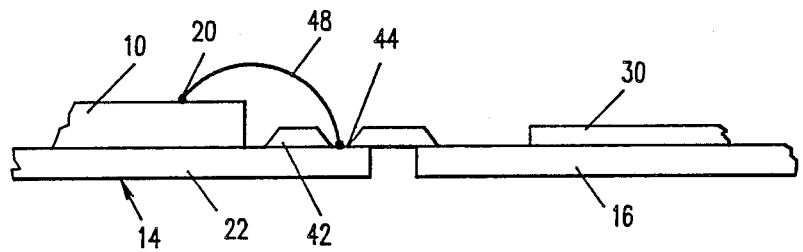

During the attachment of the IC die 10 to the die attachment pad 22 employing conventional semiconductor technology, an epoxy adhesive formed with resin is used. As is well known, the resin in the epoxy has a tendency to flow during the process of joining the die and the pad. The resin tends to flow towards the down bond channel 44 which has a number of electrical contact points to which wire leads, such as leads 46 and 48 in FIGS. 3a and 3b, are bonded. The wires 46 provide connection from the die attach pad to the inner lead fingers 16 and thus to an external control for supplying voltage to the IC die attachment pad. Wires 48 provide connection from the die attachment pad to the IC chip 10 whereby the IC device controls the polarity of the die attach pad. However, the presence of resin that flows from the adhesive makes it difficult, if not impossible, to make a secure bond between the wire leads and the electrical contact points in the down bond area.

To avoid the deleterious effect of the resin bleeding from the epoxy adhesive over the down bond channel 44 of the die attach pad, a dam 42 that circumscribes the IC die 10 is provided, as shown in FIG. 3a. The dam is formed on the surface of the die attach pad and is spaced close to the periphery of the IC die. The dam is formed preferably of Kapton (trademark of Du Pont) which is an insulating material. The dielectric Kapton material forms a continuous wall or barrier and acts effectively to impede the flow of the resin across the surface of the die attach pad and to contain the resin between the IC device 10 and the dam. As a result, when lead wires are attached to the die attach pad at the down bond channel, the resin does not interfere with the attachment of the ends of wire leads 46 to the contact points on the surface of the pad 22, or of wire leads 48.

Figure 3C:
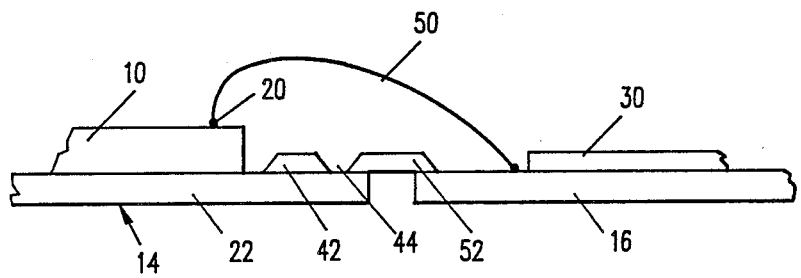
Figure 3D:
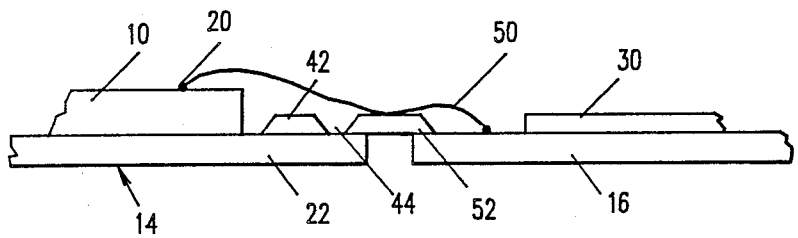

In accordance with another feature of this invention, a wedge 52 is provided between the die attach pad 22 and the lead fingers 16 so that the lead wires 50 from the IC device 10 to the lead fingers 16 are prevented from contacting the die attach pad 22. As illustrated in FIGS. 3c and 3d, the wedge 52 is formed at the area between the pad 22 and the lead finger 16 and is so positioned as to maintain the desired separation of the wire 50 from the pad. The wedge 52 may be made of Kapton or of any dielectric material that can be formed to the desired wedge shape.

Figure 4:
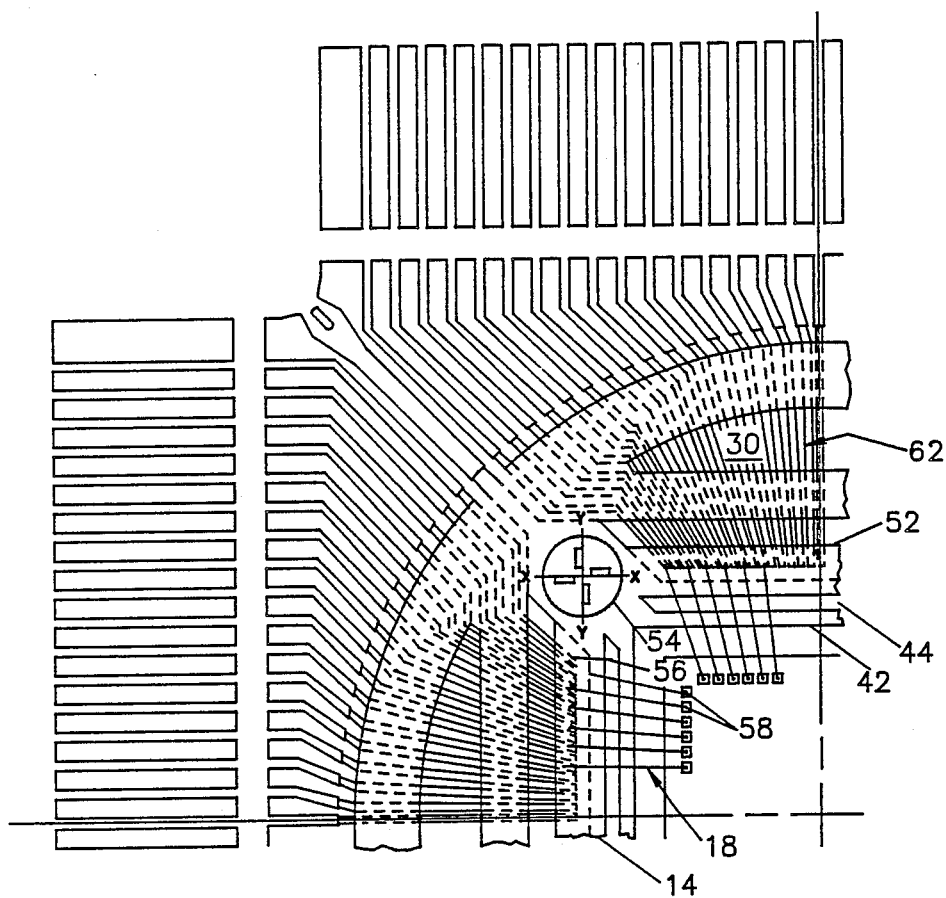
FIG. 4 is an enlarged sectional view of a portion of a support assembly for an IC chip, incorporating the dam and wedge structures and additionally a recognition pattern, as employed with this invention.

With reference to FIG. 4, a recognition pattern 54 is incorporated in the corners of the tape-like structure 14 enable alignment of electrical contact points 56 of the down bond channel and contact points 58 for precise bonding of the IC device to the inner lead fingers 16 by an automated X-Y bonder. As it is necessary to align the capillaries of the bonder from which bonding wire material is ejected to the contact points at which wire leads are connected very accurately, the recognition pattern serves as a target to enable precise alignment. The recognition pattern is characterized by providing pairs of spaced geometric elements, which are illustrated as being rectangular in this embodiment, that are formed by etching a specified design on the metal layer of the tape structure 14. The spaced elements of one pair define a first axis and the spaced elements of a second pair define an axis different in direction than the first axis. The spaced elements include components that are collinear and aligned along one axis or direction and at least two other collinear components aligned along a second axis, preferably at 90° to the first axis. An optical scanner scans along the linear direction provided by the edges of a pair of components of the pattern and if the edges are not scanned in precise alignment, an error signal is generated which is fed to a computer. The computer then adjusts the X-Y position of the automated bonder so that it is properly aligned with relation to the contact points that are to be bonded.

Figure 5:
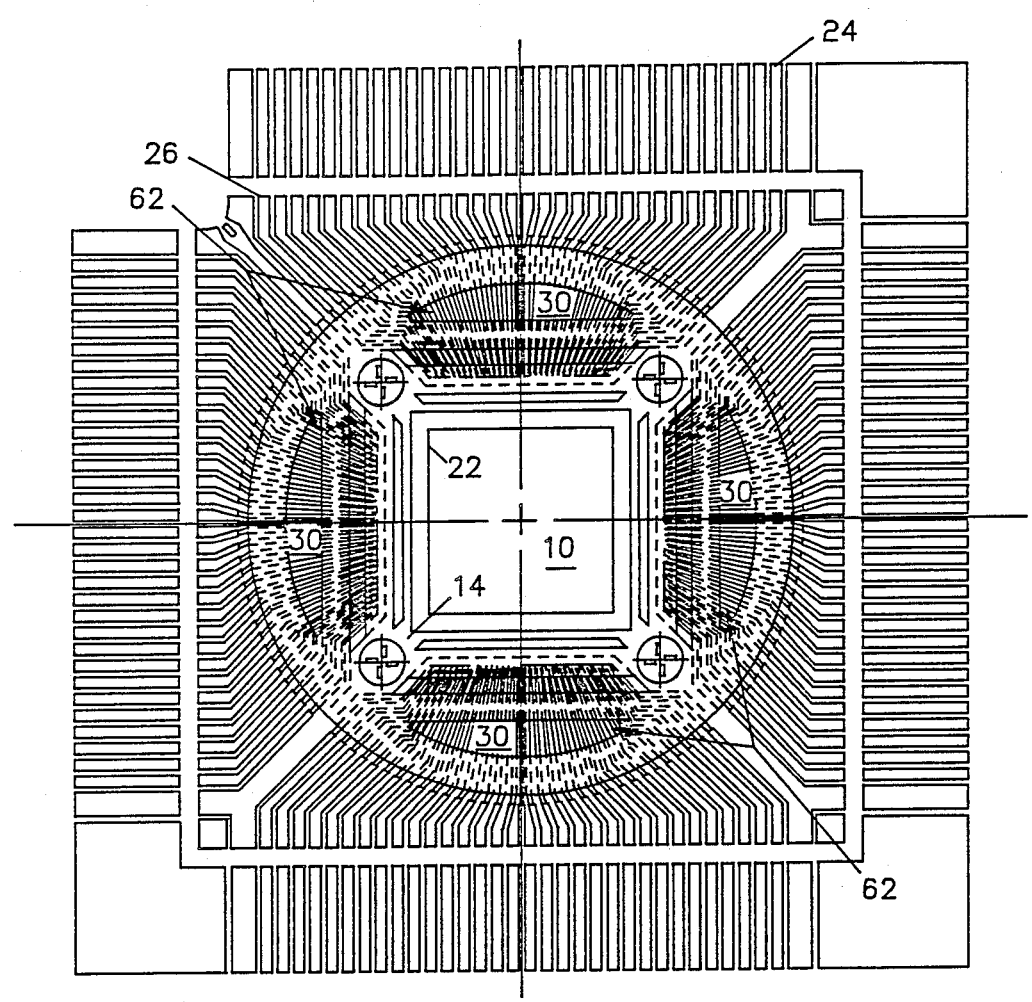
FIG. 5 is a sectional view of a portion of a support assembly for an IC chip, incorporating the feature of using a molding compound in cavities between Kapton material to secure the lead fingers of the assembly, in accordance with this invention.

FIGS. 4 and 5 illustrate another feature of this invention which is directed to the wire leads of the IC tape structure and frame assembly. During manufacture of the tape assembly, an insulating film 60 preferably made of Kapton is deposited over the tape-like structure 14 to secure the thin flexible lead fingers 16 and to provide insulation between the individual leads. The insulating film 60 is etched to produce cavities 62 that are interposed between the remaining unetched sections of the insulating Kapton film. The assembly including the tape 14, the frame 12 and the etched Kapton film with the cavities is housed in a plastic package 32, as is well known in the industry. In keeping with this invention, an epoxy molding compound is then forced through an aperture of the package mold to form the plastic package. The molding compound flows into the cavities between the Kapton sections. The molding compound effectively locks around each conductive lead to provide electrical insulation and to secure the thin flexible lead fingers firmly in place.

The use of the epoxy molding compound effectively lowers the moisture penetration, and since the Kapton is known to be sensitive to moisture and tends to become brittle, the partial substitution of the molding compound minimizes problems that were encountered with a continuous complete layer of Kapton. Furthermore, the problem of delamination, which a continuous film of Kapton can experience, is substantially eliminated. Also, by having the cavities filled with molding compound, the detrimental effects of clam shelling is reduced.

What is claimed is:

1. An integrated circuit device package comprising:
   a relatively thin flexible tape-like structure having inner lead fingers and outer lead fingers;
   a rigid lead frame joined to said structure having internal leads aligned to and connected to said outer lead fingers;
   an integrated circuit die on which an integrated circuit is formed;
   a die attach pad to which said integrated circuit die is joined seated in said structure;
   wire leads connected to said integrated circuit die and to said lead fingers;
   a raised strip formed on said pad for separating said wire leads from said die attach pad to prevent contact of said wires with said pad; and
   a recognition pattern formed on said tape-like structure.

2. An integrated circuit device package as in claim 1, wherein said recognition pattern comprises pairs of spaced elements, each pair having components that are collinear to define first and second axes.

3. An integrated circuit device package as in claim 2, wherein said first axis is substantially orthogonal to said second axis.

4. An integrated circuit device package as in claim 2, wherein said spaced elements are rectangular and sides of said rectangles are aligned along said first and second axes.

5. An integrated circuit device package as in claim 1, including an insulating film deposited over said tape-like structure, said film having cavities formed therein, and an epoxy molding compound contained within said cavities.

* * * * *